United States Patent [19]

Kameyama et al.

[11] Patent Number: 5,296,388

[45] Date of Patent: Mar. 22, 1994

[54] FABRICATION METHOD FOR SEMICONDUCTOR DEVICES

[75] Inventors: Shuichi Kameyama, Itami; Atsushi Hori; Hiroshi Shimomura, both of Moriguchi; Mizuki Segawa, Hirakata, all of Japan

[73] Assignee: Matsushita Electric Industrial Co., Ltd., Osaka, Japan

[21] Appl. No.: 729,490

[22] Filed: Jul. 12, 1991

[30] Foreign Application Priority Data

Jul. 13, 1990 [JP] Japan ................................. 2-186533
Jul. 18, 1990 [JP] Japan ................................. 2-191200

[51] Int. Cl.$^5$ ........................................ H01L 21/265
[52] U.S. Cl. ........................................ 437/31; 437/28; 437/162; 437/191; 148/DIG. 11; 148/DIG. 124
[58] Field of Search ................. 437/31, 32, 33, 160, 437/161, 162, 28, 191; 148/DIG. 124, DIG. 123, DIG. 122

[56] References Cited

U.S. PATENT DOCUMENTS

| | | | |
|---|---|---|---|
| 4,063,967 | 12/1977 | Graul et al. | 148/DIG. 124 |
| 4,500,388 | 2/1985 | Ohmura et al. | 148/DIG. 123 |
| 4,629,520 | 12/1986 | Ueno et al. | 437/31 |
| 4,663,825 | 5/1987 | Maeda | 437/191 |
| 4,800,177 | 1/1989 | Nakamae | 148/DIG. 124 |
| 4,977,098 | 12/1990 | Yu et al. | 437/31 |
| 5,116,770 | 5/1992 | Kameyama et al. | 437/31 |

FOREIGN PATENT DOCUMENTS

| | | | |
|---|---|---|---|
| 0090940 | 10/1983 | European Pat. Off. | 437/31 |
| 0350610 | 1/1990 | European Pat. Off. | |
| 0365107 | 4/1990 | European Pat. Off. | |
| 0204648 | 8/1988 | Japan | 437/31 |
| 0076763 | 3/1989 | Japan | 437/31 |
| 1-181561 | 7/1989 | Japan | 437/31 |
| 0026032 | 1/1990 | Japan | 437/28 |

OTHER PUBLICATIONS

Silicon Processing for the VLSI ERA, vol. 1; Wolf et al.; pp. 57-58, 295-308; 1986.

K. Kikuchi et al., "A High-Speed Bipolar LSI Process Using Self-Aligned Double Diffusion Polysilicon Technology", International Electron Devices Meeting, Technical Digest of Papers, pp. 420-423 (1986).

Ozono et al., "Redistribution of Heavily Doped Arsenic in Poly-SI Film on Single Silicon Substrate During its Solid Phase Epitaxial Growth", Semiconductor Silicon Proceedings, vol. 90-7, pp. 515-522 (1990).

Primary Examiner—Brian E. Hearn
Assistant Examiner—Michael Trinh
Attorney, Agent, or Firm—Willain Brinks Olds Hofer Gilson & Lione

[57] ABSTRACT

A fabrication method for semiconductor devices connecting a multi-crystal semiconductor thin film and a semiconductor region including a high density of an impurity formed in a single crystal semiconductor substrate. After forming a N-type semiconductor region as the emitter by ion implanting, for instance, as into a P-type semiconductor region as the base, a polysilicon thin film 114 is deposited so as to be implanted with As ions and then heat treated. In this case, an amorphous portion of the N-type semiconductor region and an amorphous silicon thin film in contact therewith are transformed by solid phase epitaxial growth so as to form a single crystal semiconductor region, a single-crystalline silicon thin film, and a polysilicon thin film, thus forming a bipolar element having an emitter.

11 Claims, 10 Drawing Sheets

FABRICATION METHOD FOR SEMICONDUCTOR DEVICES

BACKGROUND OF THE INVENTION

The present invention generally relates to a manufacturing method for semiconductor devices, and more particularly, to a manufacturing method for improving the electrical characteristic in the connection between the polycrystalline semiconductor thin film to be used for bipolar type or field effect type integrated circuit transistors and semiconductor regions including high density impurities formed in the single crystal (monocrystalline) semiconductor substrate.

In the bipolar type or field effect type semiconductor circuit, the usefulness of using polycrystalline semiconductors for creating miniaturized elements is well known. For example, in the field of silicon semiconductor bipolar technology, it has become a common practice to use polycrystalline silicon as a diffusion source for fine wirings (electrodes) or shallow junctions, and particularly, the polysilicon electrode lead-out as a means for forming an emitter region of fine planar dimensions suitable for high speed operation has become an indispensable technology.

As an example of an emitter in which arsenic is diffused from poly-silicon, there is proposed "Self-aligned Double Diffusion polysilicon technology" (K. Kikuchi et al. International Electron device meeting Technical Digest of Papers pp. 420–423, 1986). According to this technique, a shallow emitter of about 50 nanometer junction depth was obtained by subjecting arsenic with a dose amount of $1 \times 10^{16}/cm^2$ implanted into a polysilicon layer of about 300 nanometer thickness to a heat treatment at 900° C. for 30 minutes for thermal diffusion. Furthermore, as shown in FIG. 19, an emitter of about 180 nanometer junction depth was formed by using a similar polysilicon and diffusing arsenic implanted therein under conditions of heat treatment of a comparatively high temperature (1000° C., 20 min.). On the other hand, it is shown in the prior art that since diffusion at a higher temperature and a longer time is required to form a deeper emitter, the semiconductor region, such as a base region having been already formed by the foregoing process, is consequently diffused too deeply, so that it becomes impossible to obtain a transistor structure suitable for high speed operation. More specifically, in the process using thermal diffusion at a comparatively higher temperature (1000° C., 20 min.) for forming an emitter of 180 nanometer depth suitable for high speed operation, since the base region was formed beforehand by ion implanting such as boron, the depth of the base region becomes greater than 400 to 500 nanometer. For example, using a currently commercially available ion implanter, in the case of forming a p-type base region with such a minimum implant acceleration energy (for example, 25 KeV) that is most stable with a little fluctuation, the junction depth of the base becomes about 500 nanometer, and, since the depth of the emitter formed at that time is about 180 nanometer, a transistor of about 320 nanometer base width is formed. A typical collector cut-off frequency $f_T$ of a transistor of 320 nanometer base width is about 5 GHz. In order to manufacture a higher performance transistor of 10 GHz cut-off frequency $f_T$, it is necessary for the base depth to be 100 to 200 nanometer. In order for this to occur, the target width of the emitter to be formed by the thermal diffusion from polysilicon should be about 300 nanometer or more, and, accordingly, a heat treatment at a very high temperature and for a long time will be required. However, the result of such a treatment is that the base depth becomes considerably deep. Thus, using this method, there is no possibility of realizing a transistor of 100 to 200 nanometer base width.

On the other hand, as an alternative method for forming emitter-base junctions, a method has been proposed of directly implanting ions such as arsenic ions into P-type bases. For example, as shown in FIG. 20, arsenic of $1 \times 10^{16}/cm^2$ was directly ion implanted into polysilicon at an acceleration energy of 50 KeV, and subjected to a heat treatment at 1000° C. The emitter depth after the heat treatment for 60 min. diffusion time (t=60 min.) was about 430 nanometer, the depth after a 20 min. diffusion time (t=20 min.) was about 260 nanometer, while the depth after no heat treatment, that is, immediately after implanting (t=0 min.), was about 100 nanometer. As shown in FIG. 19, although the emitter depth obtained by diffusing arsenic from polysilicon through the heat treatment of 1000° C. and 20 min. was about 180 nanometer, the emitter depth obtained by directly ion implanting arsenic into silicon and subjecting to a heat treating under the same conditions as above, that is, 1000° C. and 20 min., was about 260 nanometer, as shown in FIG. 20, which was 80 nanometer deeper than the emitter depth obtained by diffusing from polysilicon. In this case, since the total amount of the arsenic impurity in silicon becomes larger in the case of direct ion implanting, the emitter resistance can be advantageously reduced. Furthermore, in the case of forming an emitter through the direct ion implanting, with respect to the lead-out method for such as Al electrode, it has become a common practice to directly lead out metallic electrodes from each emitter surface without using electrodes of polycrystalline semiconductors as intermediate layers.

As shown in FIG. 19, an additional problem with the formation of an emitter by diffusion from polysilicon is the existence of a silicon oxide thin film (residual insulation film) naturally formed between a polysilicon layer and a single crystal (monocrystalline) silicon substrate. This natural oxide film grows to a thickness of less than about 2 nanometer when non-single-crystal (non-monocrystalline, for example, polycrystalline or amorphous) semiconductor thin film such as polysilicon or amorphous silicon is deposited. Due to the variation of this thickness, the diffusion depth for the emitter becomes unstable. Furthermore, when this oxidized film becomes thick, the series resistance of the emitter is increased, resulting in deterioration or fluctuation in the transistor characteristic.

This problem makes it more difficult to lead out an electrode of a non-single-crystal material such as polysilicon or amorphous silicon from the deep emitter formed by the ion implantation method as shown in FIG. 20. That is, when polysilicon is deposited on the surface of the silicon containing a high density of surface impurities such as arsenic, the natural oxide film grows thicker than when polysilicon is deposited on the surface of a silicon surface containing a lower density of surface impurities. Thus, the ohmic contact between the highly-doped emitter and the deposited polysilicon is further deteriorated, resulting in a rapid increase in the resistance of the emitter.

Accordingly, the first technical task to be attained is the removal of the instability due to the natural oxide film.

The second technical task of the present invention is to form a comparatively deep or comparatively shallow junction of a predetermined depth through a heat treatment using a comparatively low diffusion temperature or using a comparatively high temperature for a short time. If a homogeneous junction of a predetermined depth for such as an emitter and the like can be formed through a heat treatment using a comparatively low diffusion temperature or using a comparatively high temperature and a short time, a transistor structure of narrow base width having an excellent high speed characteristic can be realized. For example, in order to form an emitter of about 250 nanometer depth according to a method such as the one shown in FIG. 19, a high temperature heat treatment of 1000° C. for about 20 min. is required, resulting in the base region formed simultaneously being diffused too deeply, so that a transistor structure suitable for high speed operation can not be realized.

Furthermore, using the conventional method mentioned above, there is the additional problem that a solid phase epitaxial growth of silicon in the polysilicon film realigns the polysilicon film with the silicon substrate, when the emitter diffusion from polysilicon is performed at 900° C.

This phenomenon is reported in a paper by S. Ozono et. al. entitled "Redistribution of heavily doped Arsenic in Poly-Si Film on Single Silicon Substrate during its Solid Phase Epitaxial Growth", 177th Electrochemical Society Meeting, Abstract No. 378, 1990, pp. 569 to 570.

In instances where influences due to the silicon oxide film, process contamination, etching damage by plasma and the like are small at the boundary (interface) between the polysilicon electrode and the silicon substrate, it is known that, when arsenic in polysilicon is thermally diffused, a solid phase epitaxial growth of silicon aligned to the face orientation of the silicon substrate takes place and a re-crystallized silicon of about 200 nanometer height is formed. By the formation of the re-crystallized silicon, the depth of the emitter diffusion layer becomes shallower than in the case where no epitaxial growth takes place and the current gain of the emitter is reduced. In the case of the formation of a solid phase epitaxial layer, the reliability of the transistor is reduced as the emitter area increases.

Thus, the third technical task to be attained by the present invention is the prevention of the solid phase epitaxial growth upon heat treating the emitter.

In the trial fabrication for NPN transistors for 0.5 μm Bi-CMOS, accompanying the low temperature trend of the CMOS process for accomplishing a high package density, both a diffusion furnace heat treatment at 800° C. to 850° C. or a heat treatment by the Rapid Thermal Annealing (RTA) at 1000° C. to 1100° C. are proposed as heat treatment for the emitter. In the heat treatments at 800° C. to 850° C., because of the existence of a residual insulation film (natural silicon oxide film) between the polysilicon thin film and the silicon single crystal substrate, the arsenic impurities forming the emitter can not be diffused from the polysilicon thin film, and therefore, it is necessary to diffuse arsenic by a heat treatment at a high temperature but for a short time, such as RTA or the like. The NPN transistors made on the trial basis under such conditions realize a high performance of 15 GHz $f_r$ at a collector-emitter breakdown voltage ($BV_{ceo}$) of 6 V and an emitter-base breakdown voltage ($BV_{ebo}$) of 3 V. The problems with such a process to be solved in the near future are in stabilizing the emitter diffusion since RTA has poor reproducibility and ensuring the emitter-base breakdown voltage is sufficiently larger than the power supply voltage, so as to insure reliability.

The inventors of the present invention proposed a basic idea on which the present invention is based in U.S. patent application Ser. No. 378,671 filed on Jul. 12, 1989, to solve the problems mentioned above. In that application, a method is disclosed for fabricating a semiconductor device which comprises the steps of providing a semiconductor substrate having a single crystalline semiconductor layer of a first conductivity type, forming a first semiconductive region of a second conductivity type in the single crystalline semiconductor layer, forming a dielectric film on the semiconductor substrate either prior to or after the formation of the first semiconductor region, making at least one opening in the dielectric film to expose the first semiconductive region, forming a first non-crystalline semiconductor film on the surface of the first semiconductive region in the opening, forming a second semiconductive region of the first conductivity type into the first semiconductive region by implanting an impurity of the first conductivity type through the first semiconductor film, forming a second non-crystalline semiconductor film on the first semiconductor film and incorporating an impurity of the first conductivity type into the second semiconductor film.

SUMMARY OF THE INVENTION

An essential objective of the present invention is to provide a new method on the basis of the invention mentioned above which is able to form a homogeneous emitter of a desired depth with good reproducibility.

Another objective of the present invention is to provide a fabrication method for semiconductor devices which is capable of removing instabilities due to a natural oxide film formed upon depositing a non-single crystal semiconductor film on a single crystal substrate such as a single crystal silicon substrate.

A further objective of the present invention is to provide a fabrication method for semiconductor devices which is capable of utilizing the solid phase epitaxial growth caused during the emitter diffusion to reduce the base current of a transistor and, thereby, increase the current gain thereof.

A still further objective of the present invention is to provide a fabrication method for semiconductor devices which produces high performance devices by reducing junction capacitances.

In order to accomplish the above-described objectives, the present invention provides a fabrication method for semiconductor devices comprising steps of forming a first semiconductor region of a second conductive type in a single crystal semiconductor layer of a first conductive type, forming a first non-single crystalline semiconductor thin film on the surface of the semiconductor layer with a first residual insulation film put therebetween, implanting ions of an impurity of the first conductive type, through the first semiconductor thin film, into the first semiconductor region to form a second semiconductor region of the first conductive type, so as to destroy the first residual insulation film and concurrently form amorphous regions in the second semiconductor region and the first semiconductor thin film, forming a second semiconductor thin film containing impurities of the first conductive type on the first semiconductor thin film with a second residual insulation film put therebetween, causing a solid phase epitaxial growth in the second semiconductor region and the first semiconductor thin film, while aligning to the single crystal semiconductor layer through a heat treatment to single-crystallize the first semiconductor thin film, while crystallizing the amorphous regions formed therein and forming a metallic electrode on said heat-treated second semiconductor thin film.

The following technical effects can be obtained by the fabrication method according to the present invention:

(1) By implanting an impurity of a first conductive type through a non-single crystalline first semiconductor thin film, for example, amorphous silicon or the like, a second semiconductor region of the first conductive type such as an emitter or the like is formed deeply in a first semiconductor region such as a base or the like, an emitter of homogeneous depth could be formed with good reproducibility through a heat treatment using a comparatively low diffusion temperature or a heat treatment using a comparatively high temperature for short time period, while avoiding influences due to a first thin residual insulation film (natural silicon oxidized film) that will inevitably be formed.

(2) By implanting an impurity of the first conductive type through the first semiconductor thin film of amorphous silicon or the like, the first residual insulation thin film (natural silicon oxidized film), which formed between the first semiconductor thin film and the single crystalline first semiconductor region such as the base or the like could be destroyed. Thus the ohmic contact existing between the first semiconductor thin film having been recrystallized into single crystal and serving as an emitter, and the second semiconductor region could be improved thereby to reduce the series resistance of the emitter.

(3) Since the first non-single crystalline semiconductor thin film such as polysilicon can be formed on the first semiconductor region by solid phase epitaxial growth, the thickness of the second semiconductor thin film serving as a lead-out electrode could be formed at will. Furthermore, the following effects can be obtained. Using the potential barrier for minority carriers (holes) created by the second residual insulation thin film (natural silicon oxidized film) existing between the second semiconductor thin film of the first conductive type (for example, N type) such as polysilicon or the like and the first semiconductor thin film recrystallized into single crystal and serving as an emitter, the hole current injected from the base into the emitter could be suppressed to some extent, making it difficult for the holes to arrive directly at a metallic electrode formed on the second semiconductor film. Therefore, the hole current, that is, the base current could be reduced by positively utilizing the solid phase epitaxial growth. Thus, the present invention can increase the current amplification factor of the transistor and stabilizes the value.

(4) Using the method of the present invention, the high speed characteristic of devices can be accomplished, and the reduction of junction capacitance which constitutes the key point thereof will be described below. Although the collector-base capacitance $C_{cb}$ according to the present invention is approximately equal to the value according to the usual polysilicon emitter method, the emitter-base capacitance $C_{eb}$ according to the present invention is lowered as compared with that of the usual polysilicon method, and is therefore suitable for high speed operation. The reason for this is that the invented method can form a comparatively shallow base, and therefore, the surface impurity density of the base in the emitter periphery can be reduced. In other words, since the surface impurity density of the base in the emitter periphery can be reduced, the width of the depletion layer of the emitter-base junction can be increased, thereby reducing the junction capacitance. Furthermore, since the surface impurity density of base in the emitter periphery can be decreased, the emitter-base breakdown voltage $BV_{ebo}$ can therefore be easily increased, which helps to prevent the deterioration in the reliability of bipolar transistors.

BRIEF DESCRIPTION OF THE DRAWINGS

These and other objectives and features of the present invention will become apparent from the following description taken in conjunction with the preferred embodiments thereof with reference to the accompanying drawings, in which.

DETAILED DESCRIPTION OF THE INVENTION

A first preferred embodiment wherein the manufacturing method of the present invention of the essential parts of the bipolar NPN transistor will be described with reference to FIGS. 1 to 4

Figure 1:
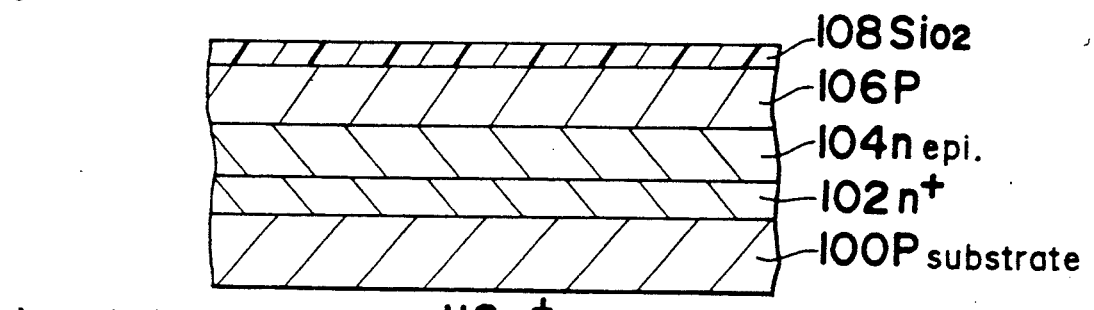
FIG. 1 is a sectional view showing the first process of the manufacturing method for the essential parts of the bipolar NPN transistor in a first preferred embodiment of the present invention.

As shown in FIG. 1, on a P-type single crystal silicon semiconductor substrate 100, an N-type buried layer 102 was formed so as to form an N-type epitaxial semiconductor layer 104. On this semiconductor layer 104, a silicon oxide film 108 of about 120 nanometer acting as an insulation film was formed, and boron of (1 to 3)$\times 10^{13} cm^{-2}$ concentration was implanted by low energy ion implanting, and further, a P-type semiconductor region 106 acting as a base (a first semiconductor region) was formed by a heat treatment of about 850° C.

Figure 2:
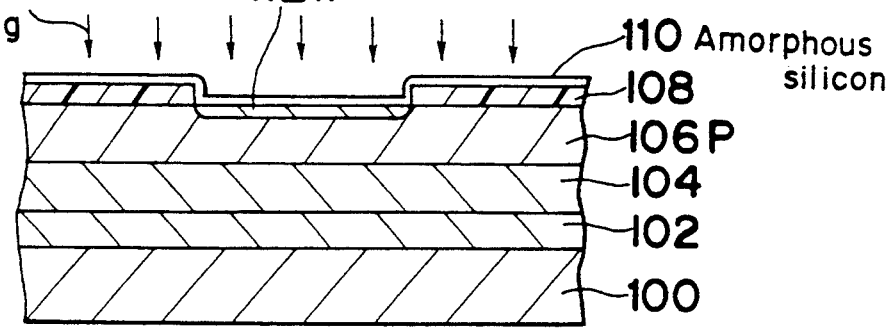
FIG. 2 is a sectional view showing the second process of the manufacturing method for the essential parts of the bipolar NPN transistor in the first preferred embodiment of the present invention.

As shown in FIG. 2, after forming an opening through etching on the oxide film 108 at the position where an emitter is to be formed by a usual photo-mask process, an amorphous silicon thin film 110 of about 35 nanometer (a first semiconductor thin film) was deposited, arsenic of a concentration $1 \times 10^{15}$ to $1 \times 10^{16} cm^{-2}$ was ion implanted through the amorphous silicon thin film 110 with acceleration energy of 60 to 100 KeV so as to form an N-type semiconductor region (a second semiconductor region) as an emitter. At this time, the natural oxide film (a first residual insulation film; not shown) of about 1 nanometer that formed between the P-type semiconductor region 106 and the amorphous silicon thin film 110 as a first semiconductor thin film was destroyed by the ion implantation, and at the same time, the N-type semiconductor region 112 scheduled as an emitter (a second semiconductor region) was transformed into an amorphous structure.

Figure 3:
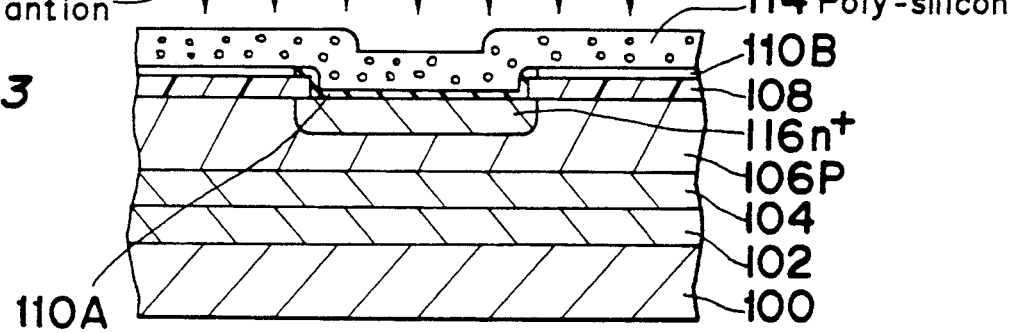
FIG. 3 is a sectional view showing the third process of the manufacturing method of the bipolar NPN transistor in the first preferred embodiment of the present invention.

As shown in FIG. 3, a polysilicon thin film 114 of about 250 nanometer as a second semiconductor thin film was deposited on the amorphous silicon semiconductor thin film 110. In this case, a natural oxidized film (a second residual insulation film; not shown) of about 1 nanometer was formed between the amorphous silicon thin film 110 and the polysilicon thin film 114. After arsenic ion implantation of $8 \times 10^{15} cm^{-2}$ onto the polysilicon thin film 114 with an acceleration energy of 50 KeV, the N-type semiconductor region 116 as an emitter of about 180 nanometer depth was formed by a heat treatment of about 850° C. for 30 min. Furthermore, the junction depth of the p-type semiconductor region 106 acting as the base became about 300 nanometer. At this time, the amorphous portion in the N-type semiconductor region 116 (a second semiconductor region) and the amorphous silicon thin film 110 in contact therewith are transformed by the solid phase epitaxial growth into a semiconductor region of a single crystal 116, a silicon thin film of single crystal 110A, and a polysilicon thin film 110B.

Figure 4:
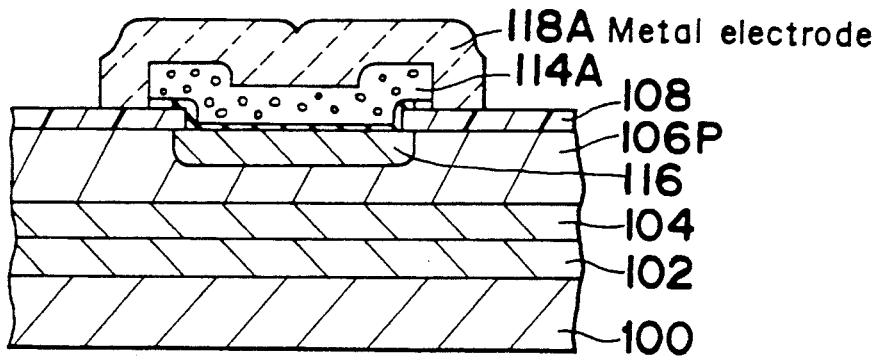
FIG. 4 is a sectional view showing the fourth process of the manufacturing method for the essential parts of the bipolar NPN transistor in the first preferred embodiment of the present invention.

As shown in FIG. 4, after forming an electrode 114A of polysilicon film pattern by the photomask process, an aluminum electrode 118A or the like was formed by the usual manufacturing method.

In observing the state of the emitter portion subjected to the final heat treatment with a transparent electron microscopy (TEM), silicon oxides transformed in "ball up" shape (the destroyed remnants of the first residual insulation film) were observed on the boundary between the first N-type semiconductor region 116 (the second semiconductor region) implanted with arsenic ions as the emitter and the first silicon thin film 110 of 35 nanometer. Further, the second polysilicon semiconductor thin film 114 was observed on the first silicon film 110 transformed into single crystal. Although the first silicon semiconductor thin film 110 of 35 nanometer was amorphous at the time of depositing, in the final state, it was aligned to the silicon substrate (the semiconductor layer 104 where the base was formed) and recrystallized into single crystal state.

This recrystallization was accomplished by the fact that by arsenic ion implantation onto the emitter, the silicon oxide film (the first residual insulation film) was destroyed, with the most parts of the emitter region (the second semiconductor region) formed in the silicon substrate being simultaneously changed into amorphous states, a solid phase epitaxial growth took place from the silicon substrate of single crystal state increasingly by subsequent heat treatments. Additionally, the second semiconductor region of amorphous state in the silicon substrate and the first silicon semiconductor thin film of amorphous state were sequentially transformed into single crystals.

Technical merits due to the steps according to the present invention can be enumerated as follows.

In the first place, by implanting an impurity of a first conductive type through a first semiconductor thin film 110 of amorphous state (for example, amorphous silicon or multi-crystal silicon), a second semiconductor region 116 of the first conductive type acting as an emitter could be formed deeply in a first semiconductor region 106 acting as a base, whereby an emitter of homogeneous depth could be formed with good reproducibility through a heat treatment using a comparatively low diffusion temperature or a comparatively high temperature for a short time period while eliminating the influence of a first residual insulation thin film (natural oxidized silicon film).

Secondly, since the first residual insulation thin film produced between this first semiconductor thin film 110 and the first semiconductor region 106 of single crystal acting as the base could be destroyed by ion implantation of impurities of the first conductive type through the first semiconductor thin film 110 made of amorphous silicon, the ohmic contact between the first semiconductor thin film 110 recrystallized into single crystal acting as the emitter and the second semiconductor region 116 could be improved, thereby reducing the series resistance of the emitter.

Thirdly, since the second semiconductor thin film 114 made of polysilicon could be formed on the first semiconductor thin film 110 of single crystal by the solid phase epitaxial growth, the second semiconductor thin film for the lead-out electrode could be formed to a desired thickness at will.

Fourthly, the potential barrier for blocking the minority carriers is realized by the silicon oxide film (the second residual insulation film) not in "ball up" shape existing on the boundary between the first silicon semiconductor thin film 110 of single crystal and the second silicon film 114 of polysilicon. This silicon oxide film reduces the base current and thus the current amplification factor is improved. Since the deep emitter having good crystallinity is large with respect to the total number (Gammel number) of atoms of impurities (arsenic) activated or ionized in the emitter portion, it tends to reduce the base current because each hole has an increased probability of being annihilated by a free electron as it diffuses toward the emitter contact. Because of the potential barrier of the silicon oxide film existing on the boundary between the first silicon semiconductor thin film 110 and the second silicon film 114 of polysilicon, a larger current amplification factor can be obtained as compared with the common polysilicon emitter.

Fifthly, by the method according to the present invention, the reduction of the junction capacitance which constitutes one of the necessary points for achieving the high speed characteristic of devices can be realized. Although the collector-base capacitance $C_{cb}$ according to the present invention is nearly equal to the value obtained by the usual polysilicon emitter method, the emitter-base capacitance $C_{eb}$ obtained thereby is reduced as compared with that produced by the usual polysilicon emitter method and adapted for high speed operation. This is because the method according to the present invention enables the base to be formed comparatively deeply, and therefore, the surface impurity density of the base at the emitter periphery can be decreased. Namely, since the surface density of the base at the emitter periphery can be decreased, the emitter-base breakdown voltage $BV_{ebo}$ can be easily increased, which helps to prevent the deterioration of the transistor reliability.

Furthermore, the noteworthy manufacturing features of the present invention are described below.

When an amorphous silicon film is used as the first semiconductor thin film 110, the channeling phenomenon of arsenic ions at the time of ion implanting onto the emitter can be held lower than in the case of polysilicon film. Thus, the depth of the emitter region implanted can be homogenized, resulting in an improvement in suppressing the fluctuation of the electrical characteristic.

When amorphous film is deposited as the first semiconductor thin film, since the growth rate of the film at the time of depositing is smaller than that of a polysilicon film, a good reproducibility with less unevenness of the film thickness between trial manufacture batches can be obtained. However, even when variations of the film thickness take place between trial manufacture batches, if the deposited film thickness is monitored, the variation of the characteristic can be controlled by changing the acceleration energy for arsenic ions implanted onto the emitter.

Furthermore, although an NPN transistor according to the usual polysilicon emitter method was simultaneously made upon trial basis through a heat treatment of 900° C., the transistor made through the heat treatment of 900° C. according to the present invention showed a better reproducibility of the current amplification factor. Using a heat treatment of less than 900° C., it is difficult to form an emitter with a good reproducibility by the usual polysilicon emitter method because of the instability of the natural oxide film thickness of the first residual insulation film.

In the processes of the present invention, improvements can be achieved when further high speed performance of the transistor characteristic is the aim. For example, in the process of forming the first semiconductor region in the first single crystal semiconductor layer of the first conductive type, the method of forming the first semiconductor region of the second conductive type acting as a base in the semiconductor layer can be adopted by ion implantation of the impurities of the second conductive type through the first non-single-crystal semiconductor thin film. In this case, since the base and the emitter can be formed self-aligned by ion implanting the impurities of arsenic and boron through the same first semiconductor thin film, the reproducibility and controllability of the base width (the difference between base depth and emitter depth) are improved.

Namely, the first semiconductor thin film having been non-single crystalline (amorphous or polysilicon) originally exhibits the following structural features in the heat treatment. Although it is apt to be single-crystallized during a low temperature heat treatment, the single-crystallized first semiconductor thin film is poly-crystallized in a high temperature, short duration heat treatment such as RTA. Generally speaking, it is difficult to visualize that the semiconductor film that was once single-crystallized becomes poly-crystallized in a high temperature heat treatment. However, the first semiconductor thin film can be poly-crystallized after single-crystallization thereof. This seems to be based on the fact that the crystalline state of the first semiconductor thin film is essentially unstable because a solid phase epitaxial growth results from the single crystalline substrate via the silicon oxide deformed into "ball up"

shape (the destroyed remnants of the first residual insulation film). Thus, the upper portion of the single-crystallized first semiconductor thin film in contact with the poly-crystalline second semiconductor thin film is poly-crystallized when subjected to a high temperature heat treatment such as RTA.

As described above, using the method according to the present invention, a vertical type NPN transistor of an improved current amplification factor was formed, and a narrow base structure of about 120 nanometer base width, which is excellent for high speed performance was obtained. By further increasing the acceleration energy for the arsenic ion implantation, the emitter can be formed at an even greater depth so as to realize a high speed structure of about 100 nanometer base width.

In this manner, by ion implantation of arsenic through the first semiconductor thin film acting as an emitter, an emitter of a desired depth could be formed at a comparatively low diffusion temperature, while eliminating the series resistance due to the natural oxide film.

Subsequently, a second preferred embodiment wherein the method of the present invention for manufacturing bipolar NPN transistors will be described with reference to FIGS. 5 to 9.

Figure 5:
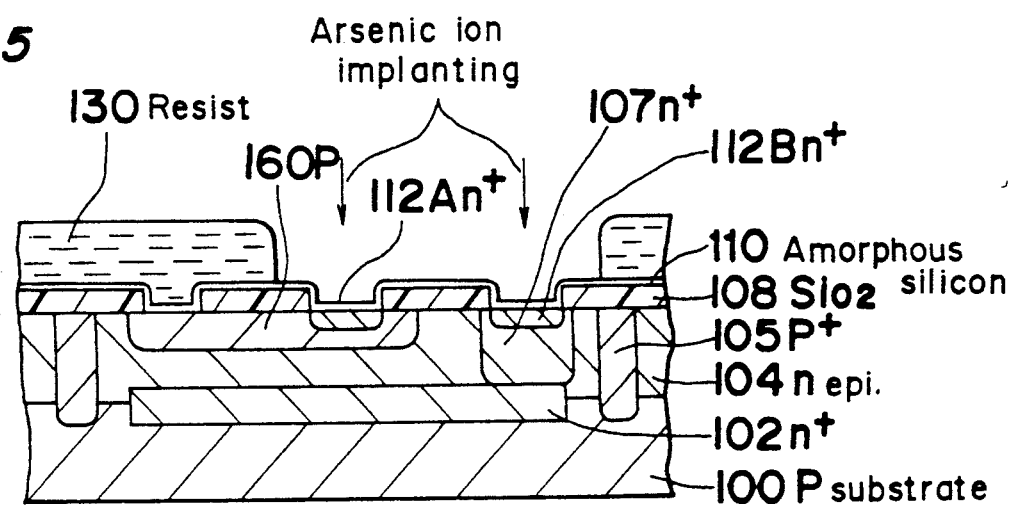
FIG. 5 is a sectional view showing the first process of the manufacturing method for the essential parts of the bipolar NPN transistor in a second preferred embodiment of the present invention.

Referring to FIG. 5, after forming an N-type buried layer 102 on a P-type single crystal silicon semiconductor substrate 100, an N-type epitaxial semiconductor layer 104 was formed. A P-type element isolation region 105 was formed, and after forming a silicon oxide film 108 of about 120 nanometer as an insulation film, boron of $(1 \text{ to } 3) \times 10^{13} \text{ cm}^{-2}$ dose amount was selectively injected into the semiconductor layer 104 by ion implantation so as to form a P-type semiconductor region 106 acting as the base (a first semiconductor region). Similarly, phosphorus of $5 \times 10^{13} \text{cm}^{-2}$ dose amount was selectively injected into the semiconductor layer 104 by ion implantation so as to form an N-type semiconductor region acting as a collector lead-out region, and the semiconductor regions 106 and 107 were diffused through a heat treatment of about 900° C. At this stage, an opening for a base and an opening for an emitter were formed in the oxide film 108 on the P-type semiconductor region 106, and at the same time, after forming an opening for a collector on the N-type semiconductor region 107 acting as a collector lead-out region, an amorphous silicon thin film 110 (a first semiconductor thin film) of about 35 nanometer thickness was deposited all over the surface. By ion implanting arsenic at $1 \times 10^{15}$ to $1 \times 10^{16} \text{ cm}^{-2}$ concentration with an acceleration energy of 60 to 100 KeV with a photoresist 130 acting as a mask through the amorphous silicon thin film 110, a N-type semiconductor region 112A (a second semiconductor region) acting as an emitter and an N-type semiconductor region 112B acting as a collector lead-out region were formed. In this case, the natural oxide film of about 1 nanometer thickness (a first residual insulation film; not shown) formed between the epitaxial semiconductor layer 104 and the amorphous silicon thin film 110 acting as a first semiconductor thin film was destroyed by the ion implanting, and at the same time, most of the n-type semiconductor region 112A acting as the emitter was changed into amorphous state.

Figure 6:
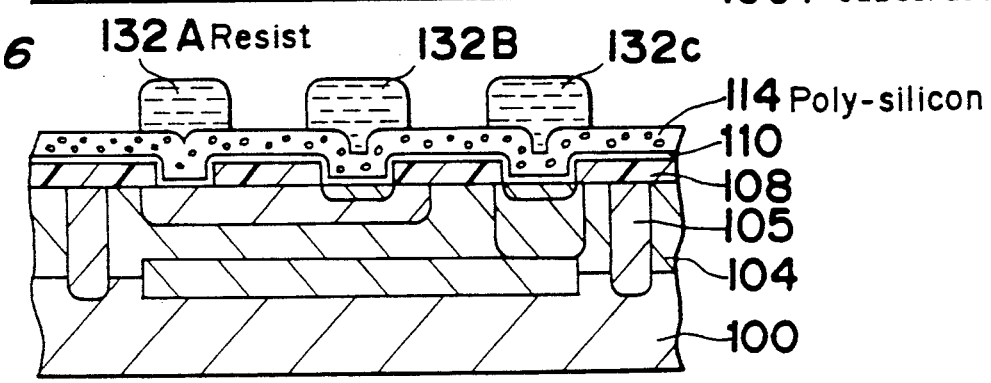
FIG. 6 is a sectional view showing the second process of the manufacturing method for the essential parts of the bipolar NPN transistor in the second preferred embodiment of the present invention.

As shown in FIG. 6, after depositing polysilicon thin film 114 (a second semiconductor thin film) of about 250 nanometer thickness on the amorphous polysilicon 110, resist patterns 132A, 132B, and 132C were respectively formed on the polysilicon thin film 114 and deposited on the base opening, emitter opening, and collector opening. At this time, a natural oxide film (a second residual insulation film; not shown) of about 1 nanometer thickness was formed between the amorphous silicon thin film 110 and the polysilicon thin film 114.

Figure 7:
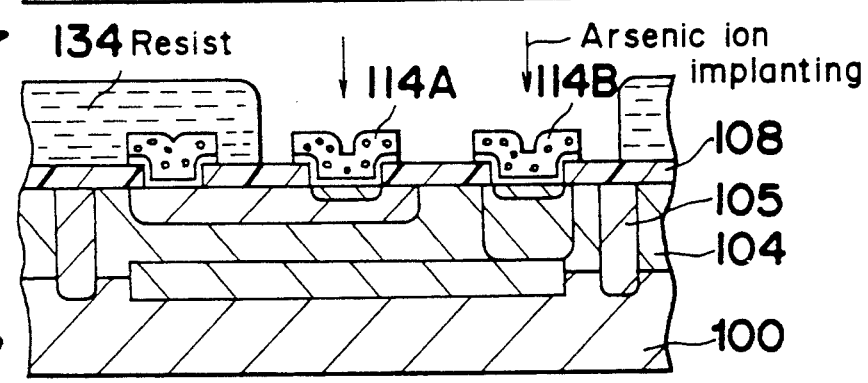
FIG. 7 is a sectional view showing the third process of the manufacturing method for the essential parts of the bipolar NPN transistor in the second preferred embodiment of the present invention.

As shown in FIG. 7, after masking resist patterns 132A, 132B, and 132C (not shown) and patterning the polysilicon thin film 114 and the like, resist patterns 132A, 132B and 132C were removed, and then, a resist pattern 134 was formed by a photomask process. Using this pattern as a mask, arsenic of $8 \times 10^{15} \text{ cm}^{-2}$ concentration was ion implanted with an acceleration energy of 50 KeV into the polysilicon thin film 114A and 114B.

Figure 8:
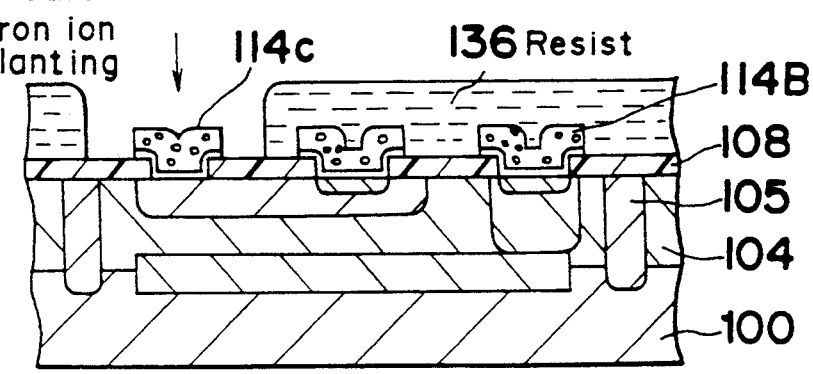
FIG. 8 is a sectional view showing the fourth process of the manufacturing method for the essential parts of the bipolar NPN transistor in the second preferred embodiment of the present invention.

As shown in FIG. 8, a resist pattern 136 was formed by the photomask process. With this as a mask, boron of $8 \times 10^{15} \text{ cm}^{-2}$ concentration was ion implanted with an acceleration energy of over 100 KeV to cause deeper implantation through the polysilicon thin film 114C.

Figure 9:
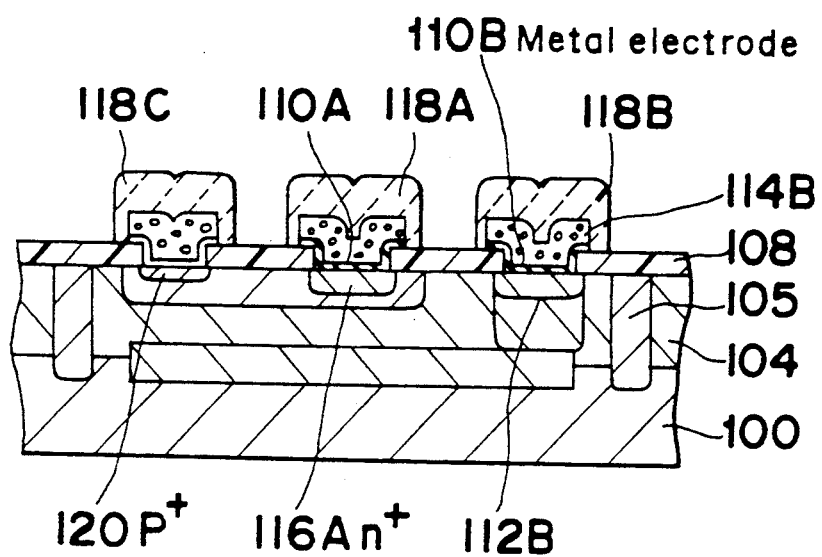
FIG. 9 is a sectional view showing the fifth process of the manufacturing method for the essential parts of the bipolar NPN transistor in the second preferred embodiment of the present invention.

As shown in FIG. 9, through a diffusion furnace heat treatment of about 850° C. for 30 min. and further through an RTA heat treatment of about 1000° C. for 10 sec., a P-type semiconductor region 120 of about 200 nanometer depth was formed, and at the same time, an N-type semiconductor region 112A acting as the emitter of about 200 nano-meter depth, and an N-type semiconductor region 112B as the collector lead-out region were diffused. At this time, the amorphous portion of the N-type semiconductor region 112A and the amorphous silicon thin film 110A in contact therewith were transformed by the solid phase epitaxial growth into a single crystal semiconductor region 116A, and single crystal silicon thin films 110a, 110b, and 110C.

As described above, using the method according to the present invention, a similar effect to that of the first preferred embodiment was obtained. For example, by ion implantation of arsenic, or other group V N-type dopants, through the first semiconductor thin film 110 acting as the thin film of amorphous silicon or the like for the emitter lead-out electrode, a homogeneous emitter of a desired depth could be formed with a low series resistance through a first heat treatment using a comparatively low diffusion temperature (700° to 890° C.) and a second heat treatment using a comparatively high temperature (900° to 1100° C.) for a short time (5 sec. to several min.). Similarly, the polysilicon base lead-out electrode could be simultaneously formed homogeneously and with a low series resistance.

The RTA heat treatment is characterized in that, since it is of a short time, the diffusion in semiconductor regions such as the emitter and the like that include ion-implanted dopants is retarded, which is suitable for forming a very shallow junction. Since it is a high temperature heat treatment, the electrical activation rate of impurity atoms in the emitter semiconductor region is increased so as to reduce the electric resistance of the semiconductor region, thereby advantageously reducing the emitter resistance. Furthermore, since the improvement in the electric activation rate of the impurity atoms in the emitter semiconductor region means an increase in Gammel number, it leads to a reduction of the base current, resulting in an increase of the current amplification factor and an improvement of the transistor performance. Similarly, RTA advantageously reduces the electrical resistance (sheet resistance) of the second semiconductor thin film 114, contributing to reduction of the resistance of the emitter electrode.

However, according to the result of the experiment regarding RTA, when the heat treatment temperature of RTA exceeds 1100° C., the diffusion in the semiconductor regions such as the emitter and the base become too large to form a junction of a proper depth. Accordingly, RTA as the second heat treatment must be conducted at a temperature of more than 900° C. (for example, 920° C.) and less than 1100° C. In this case, it is desirable to conduct the first heat treatment at a temperature lower than that for the second heat treatment and at which the solid phase epitaxial growth takes place.

Figure 22:
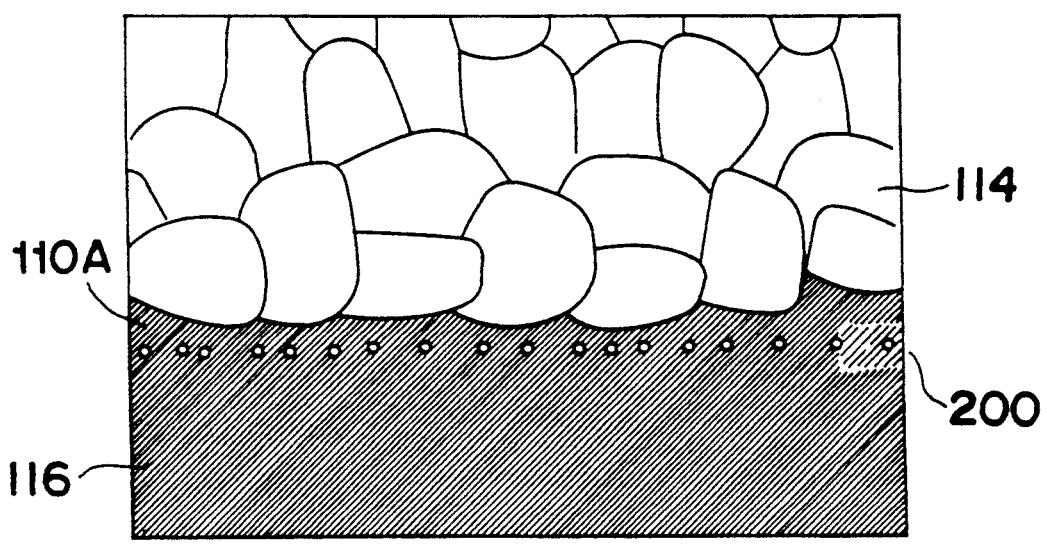
FIG. 22 is a schematic cross-sectional view similar to FIG. 21 which shows the emitter portion having been subjected to RTA heat treatment according to the second preferred embodiment of the present invention.

In observing the state of the emitter portion after the RTA heat treatment of 1050° to 1100° C. with a TEM, as shown in FIG. 22, silicon oxides 200 (destroyed first residual insulation film) transformed into "ball up" shape were found on the boundary between the N-type second semiconductor region 116 acting as the emitter implanted with arsenic ions and the first silicon semiconductor thin film 110 of 35 nanometer thickness. Furthermore, on the first silicon semiconductor film 110A nearly transformed into single crystal, the second silicon semicondcutor thin film 114 was observed remaining in the polysilicon state. The first silicon semiconductor thin film 110 of 35 nanometer which was amorphous at the time of depositing was, in the state after RTA heat treatment, oriented to the silicon substrate and transformed into single crystal on the bottom side of the first semiconductor thin film adjacent to the silicon substrate (the semiconductor layer 104 wherein the base is formed), but on the top side of the first semiconductor thin film 110 adjacent to the second semiconductor thin film, a polysilicon portion continued from the second semiconductor thin film was observed.

Furthermore, as is known conventionally, the natural oxide film (in the case of the present embodiment, the second residual insulation film) existing on the boundary between the single crystal semiconductor (in the present embodiment, the first semiconductor thin film 110 transformed into single crystal) and the polysilicon thin film formed thereon (in the present embodiment, the second semiconductor thin film) was destroyed by RTA heat treatment of a comparatively high temperature, and clear traces thereof were difficult to observe.

One generally known example of the epitaxial growth on the emitter portion is understood as the following phenomenon. The solid phase epitaxial growth taking place between the single crystal substrate (base region) and the polysilicon thin film for the emitter is such that the pillar shaped single crystal region grown up from the single crystal substrate breaks through part of the boundary residual insulation film so as to produce a large number of pillar-shaped single crystal regions of several tens to several hundreds nanometer height. The problems of this phenomenon are that the diffusion of arsenic or the like from the polysilicon thin film to the original single crystal substrate is hindered, whereby the junction depth of the emitter becomes unevenly shallow and the Gammel number is decreased, and that the boundary residual insulation film is destroyed, whereby the potential barrier is lowered. In the case of a shallow emitter of a small Gammel number, the effect on the potential barrier is larger than that for a shallow emitter of a large Gammel number, and the contribution to the increase of the current amplification ratio is larger. For this reason, when the solid phase epitaxial growth takes place in the ordinary polysilicon emitter, the current amplification factor is reduced to a large extent by the synchronous effect of the decrease of Gammel number and the decrease of the potential barrier.

However, in the method of the present invention, when RTA is conducted after the usual low temperature heat treatment for the solid phase epitaxial growth, the situation is different from the generally known case and on the contrary, a phenomenon of polysiliconizing (growth of polysilicon film) from the second semiconductor thin film of polysilicon into the single-crystallized first semiconductor thin film is present. Furthermore, this polysiliconizing has been confirmed to stop approximately in the first semiconductor thin film. This is considered to be due to the fact that silicon oxides changed into "ball up" shape (the destroyed remnants of the first residual insulation film) hinder this polysiliconizing.

As described above, using the method of the present invention, in the case of a heat treatment of a high temperature for a short time such as RTA, although the second residual insulation film is almost destroyed with the potential barrier being eliminated, the electrical activation of arsenic impurity atoms in the emitter portion, preliminarily ion-implanted deeply into the semiconductor layer, is improved with gammel number of the emitter being increased. It is one of the features of the present invention that since the increase of Gammel number compensates the decrease of the potential barrier, the decrease in the current amplification factor due to the latter is rare. Furthermore, since the polysiliconizing is almost stopped in the first semiconductor thin film, the homogeneity of the emitter portion is better as compared with the usual polysilicon emitter, and the fluctuation in the current amplification ratio is less.

Figure 21:
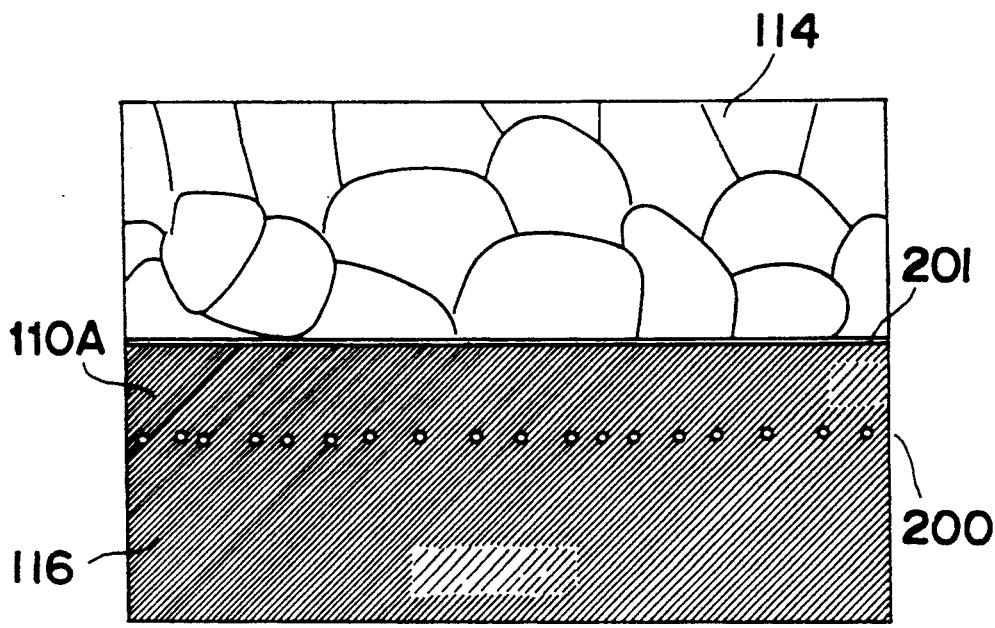
FIG. 21 is a schematic cross-sectional view for showing the emitter portion having been subjected to a final heat treatment according to the first preferred embodiment of the present invention.

Referring to FIG. 21, the emitter portion having been subjected to a final heat treatment according to the first preferred embodiment of the present invention is shown.

Referring to FIG. 22 the emitter portion having been subjected to RTA heat treatment according to the second preferred embodiment of the present invention is shown. In FIGS. 21 and 22, reference numeral 110A is a single crystallized first silicon film for the emitter region, reference numeral 114 is a second polysilicon film, reference numeral 116 is an n+ substrate for the emitter region, reference numeral 200 is a balled up oxide and reference numeral 201 is a second oxide layer.

Table 1 shows the dispersion of the current amplification ratios of the transistors formed on one silicon wafer, where dispersion is three standard deviations of the observed ratios divided by the mean of the ratios.

The dispersion ($3\sigma/h_{FE}$) of the current amplification ratio of the NPN transistor fabricated according to the present invention was 45%, 36% and 29% depending on the heating conditions at 800° C., 850° C., and 900° C., respectively. When the RTA heat treatment at 1050° C. for ten seconds was performed in addition to the low temperature heat treatment at 800° C. or 850° C., the dispersion was desirably reduced to 38% or 14%.

TABLE 1

| Temperature of heat treatment | Dispersion | With RTA |
| --- | --- | --- |
| 800° C. | 45% | 38% |
| 850° C. | 36% | 14% |
| 900° C. | 29% | — |

Figure 23:
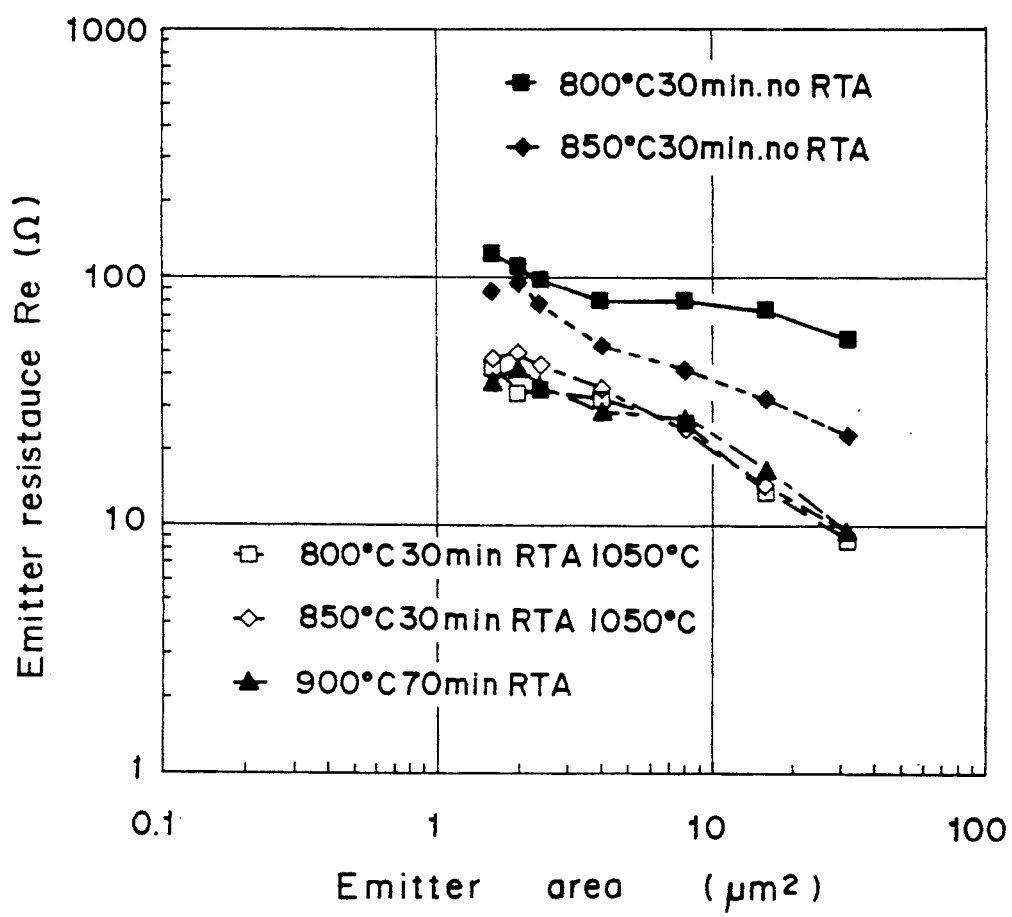
FIG. 23 is a graph showing a relation between the emitter resistance and the area of emitter window.

Further, according to FIG. 23 showing the dependency of emitter resistance on the area of emitter window, the emitter resistance is reasonably reduced to a practically usable value by the heat treatment at 850° C. for 30 minutes, though it is still large after the heat treatment at 800° C. for 30 minutes. Also, it was observed that the emitter resistance is reduced reasonably by the heat treatment at 900° C., and when RTA was made after the heat treatmetn at 800° C. for emitter resistance was reduced to the same level as the heat treatment at 900° C.

It is to be noted here that so long as the objectives of the present invention are accomplished, the order of the heat treatments, such as RTA and so on, may be changed properly and many additional heat treatments may be added.

A third preferred embodiment wherein the method of the present invention for manufacturing bipolar NPN transistors will be described below with reference to FIGS. 10 to 13.

Figure 10:
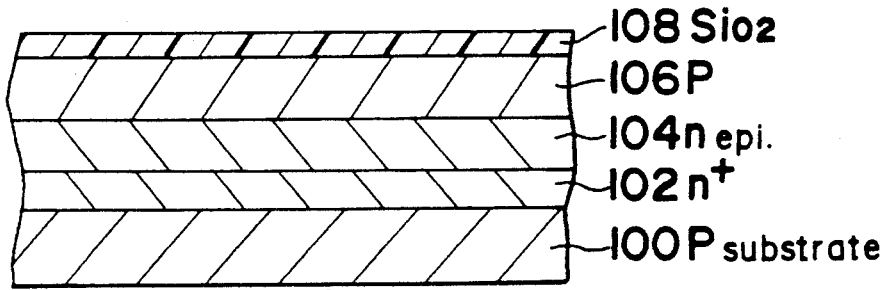
FIG. 10 is a sectional view showing the first process of the manufacturing method for the essential parts of the bipolar NPN transistor in a third preferred embodiment of the present invention.

As shown in FIG. 10, an N-type buried layer 102 was formed on a P-type single crystal silicon semiconductor substrate 100, thereby to form an n-type epitaxial semiconductor layer 104, a thick silicon oxidized film 108 of about 120 nanometer acting as an insulation film was formed, and by ion-implanting boron of 1 to $3 \times 10^{13}$ cm$^{-2}$ dose amount into the semiconductor layer 104 with a low acceleration energy, and further by a heat treatment of about 900° C., a P-type semiconductor region 106 acting as a base (a first semiconductor region) was formed.

Figure 11:
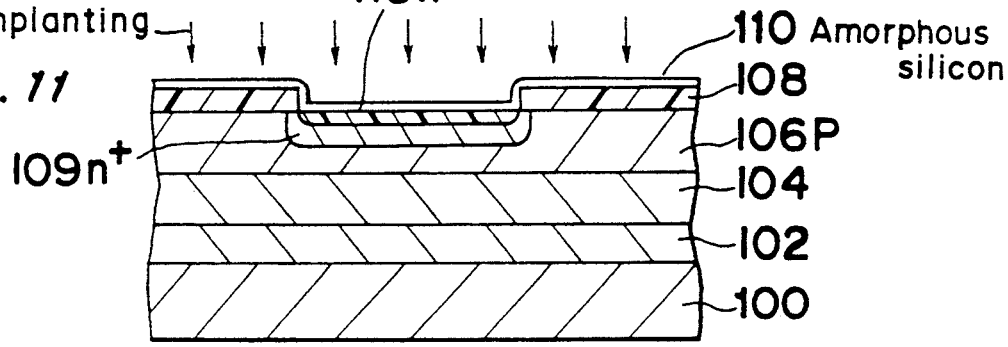
FIG. 11 is a sectional view showing the second process of the manufacturing method for the essential parts of the bipolar NPN transistor in the third preferred embodiment of the present invention.

As shown in FIG. 11, after forming an opening by etching the oxide film 108 at the portion scheduled for an emitter by the usual photomask process, arsenic of $1 \times 10^{15}$ to $1 \times 10^{16}$ cm$^{-2}$ dose amount was ion-implanted through this opening with an acceleration energy of 20 to 40 KeV so as to form an N-type semiconductor region 109 acting as an emitter (a third semiconductor region) in an N-type semiconductor layer. After depositing an amorphous first semiconductor thin film 110 on the opening, by ion implanting arsenic of $1 \times 10^{15}$ to $1 \times 10^{16}$ cm$^{-2}$ concentration with an acceleration energy of 40 to 80 KeV through the amorphous silicon thin film 110, an N-type semiconductor region 116 acting as a part of an emitter is formed in the N-type semiconductor region 109 as the second semiconductor region. At this time, a natural oxidized film (a first residual insulation film; not shown) of 1.5 to 2 nanometer thickness formed between the P-type semiconductor region 106 and the amorphous silicon thin film 110 acting as a first semiconductor thin film was destroyed by the ion implanting, and at the same time, the N-type semiconductor region 116 (a third semiconductor region) acting as a part of an emitter was mostly transformed into amorphous state.

Figure 12:
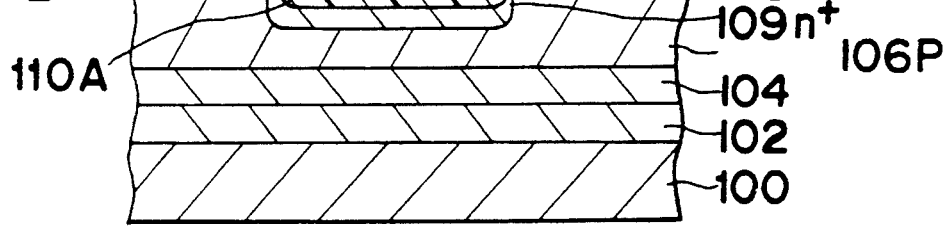
FIG. 12 is a sectional view showing the third process of the manufacturing method for the essential parts of the bipolar NPN transistor in the third preferred embodiment of the present invention.

As shown in FIG. 12, on the amorphous silicon semiconductor thin film 110, a polysilicon thin film 114 of about 250 nanometer acting as the second semiconductor thin film was deposited. At this time, a natural oxidized film (a second residual insulation film; not shown) of about 1 nanometer was formed between the amorphous silicon thin film 110 and the polysilicon thin film 114. After ion implanting arsenic of $8 \times 10^{15}$ concentration into this polysilicon thin film 114 with an acceleration energy of 50 KeV, the N-type semiconductor region 109 of about 200 nanometer depth acting as an emitter was expanded through a heat treatment of about 900° C. and 30 min. At this time, the junction depth of the P-type semiconductor region acting as the base became about 350 nanometer. Through this heat treatment, the amorphous portion of the N-type semiconductor region 116 and the amorphous silicon thin film 110 in contact therewith were transformed by the solid phase epitaxial growth into the single crystal semiconductor region 116, the single crystal silicon thin film 110A and the polysilicon thin film 110B.

Figure 13:
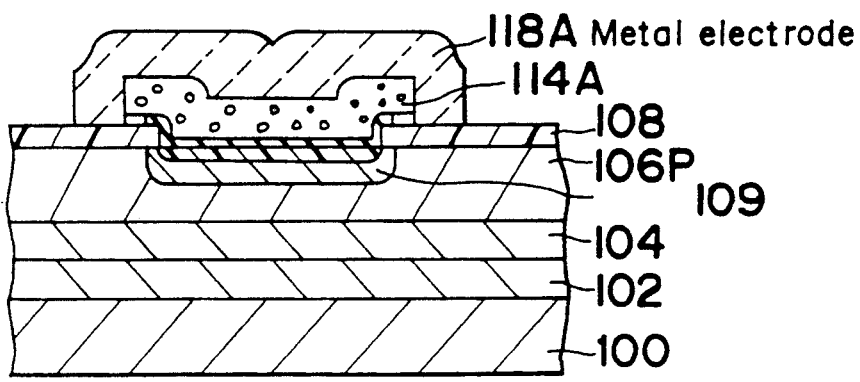
FIG. 13 is a sectional view showing the fourth process of the manufacturing method for the essential parts of the bipolar NPN transistor in the third preferred embodiment of the present invention.

As shown in FIG. 13, after forming an electrode 114 of polysilicon film pattern by the photomask process, an aluminum electrode 118A was formed by the usual manufacturing method.

In observing the state of the emitter portion after the final heat treatment with a TEN microscope, silicon oxides transformed into "ball up" shape (the destroyed remnants of the first residual insulation film) were seen on the boundary between the N-type second semiconductor region acting as the emitter implanted with arsenic ions and the first silicon semiconductor thin film of 35 nanometer. Furthermore, on the first silicon semiconductor film 110A of almost single crystal, the second silicon semiconductor thin film 114 remaining in the polysilicon state was seen. Although the first silicon semiconductor thin film 110 was amorphous at the time of depositing, in the final state, it was aligned with the single crystal silicon substrate (the semiconductor layer 104 to the base formed thereon) and transformed into single crystal.

This recrystallization was accomplished by the fact that by ion implanting arsenic into the emitter, the boundary silicon oxide film (the first residual insulation film) was destroyed. At the same time, the majority of the region acting as part of the emitter (the second semiconductor region) formed in the silicon substrate was transformed into an amorphous state, such that a solid phase epitaxial growth takes place from the single crystal silicon substrate side upward during the subsequent heat treatment. The result is that the second semiconductor region 116 of amorphous state in the silicon substrate and the first silicon thin film 110 of amorphous state were sequentially transformed into single-crystal state.

The potential barrier for hindering minority carriers according to the method of the present invention is realized by both the single-crystal first silicon semiconductor thin film 110A and the fact that the silicon oxide film (the second residual insulation film) is not formed in "ball up" shape on the boundary of the second silicon film 114 of polysilicon state. This silicon oxidized film reduces the base current, thereby improving the current amplification factor. In a good crystallinity deep emitter, since the impurity activation of the emitter portion or the total number (Gammel number) of ionized impurity atoms (arsenic) is large, it is easy to reduce the base current. Because of the potential barrier of the silicon oxide film (residual insulation film) present on the boundary between the first silicon semiconductor film 110 and the second silicon semiconductor thin film 114 of polysilicon type, the base current is further reduced. Accordingly, a larger current amplification factor may be obtained as compared with the usual polysilicon emitter.

Furthermore, according to the method of the present invention, it is easy to control the base width, namely, the difference between the base depth and the emitter depth which determines the performance of the bipolar NPN transistor. The first semiconductor region acting as the base is, in many cases, formed by ion implanting. In this case, according to the method of the present invention, the third semiconductor region 109 which determines the emitter depth is also formed by ion implanting. Since the ion implanting is better than the method of forming an emitter from a semiconductor thin film such as polysilicon with respect to the depth controllability, the method of the present invention allows the base width (difference between the base depth and the emitter depth) to be easily controlled.

Furthermore, when a thin film of two-layered constitution composed of a semiconductor thin film such as polysilicon and a conductive thin film such as metallic silicide (tungsten silicide, molybdenum silicide) is adopted in place of the second semiconductor thin film, the resistance of the emitter electrode may be advantageously reduced. Furthermore, in the case where the Gammel number of the emitter is sufficiently large, it becomes unnecessary to block the base current by the potential barrier of the thin second residual insulation film (natural silicon oxidized film). The emitter resistance may be sufficiently reduced due to the double-layered thin film, resulting in an advantageous improvement.

The noteworthy manufacturing features of the present invention are described below.

In the first place, the following method may be mentioned as a means by which to improve the process of the solid phase epitaxial growth. As an example, although arsenic ions are implanted through the first silicon semiconductor thin film 110 to form an amorphous region, a method for forming amorphous regions without creating semiconductivity therein, such as by implanting additional neutral ions such as silicon, germanium or argon before or after arsenic ion implanting may also be adopted. Furthermore, when an amorphous region is formed by implanting these neutral ions immediately before arsenic ion implanting, the channelling of arsenic ions implanted immediately thereafter may be advantageously prevented.

Furthermore, when an amorphous film is used as the first semiconductor thin film, since the growth rate of the film upon deposition is smaller as compared with a polysilicon film, a good reproducibility of less film thickness fluctuation between batches of trial manufacture can be obtained. Furthermore, if there is no problem of the film thickness control, a semiconductor thin film such as polysilicon may be employed as the first semiconductor thin film. When a polysilicon thin film is used, since this silicon semiconductor thin film is transformed into an amorphous state due to the damage caused by the implanted ions obtained when implanting As or other N-type dopants in order to form the emitter, the solid phase epitaxial growth is not hindered.

As described above, according to the third preferred embodiment of the method of the present invention, a vertical NPN transistor with an increased current amplification factor was formed, and a narrow base structure of about 150 nanometer base width with excellent high speed performance characteristics was obtained. By further increasing the acceleration energy for arsenic ion implanting, the emitter can be deepened, realizing a high speed structure of about 100 nanometer base width.

As described hereinabove, by implanting arsenic ions through the first semiconductor thin film constituting part of the emitter, while removing the effect of the series resistance of the natural oxidized film, an emitter of a desired depth could be formed with good reproducibility through a heat treatment of a comparatively low diffusion temperature (or a heat treatment of a high temperature for a short time). Furthermore, the method of the present invention may be applicable to the formation of the polysilicon electrode at the opening for the base contact, as in the second preferred embodiment. Namely, in FIG. 5, if a process of ion implanting boron or other P-type dopant into the semiconductor region constituting the P-type base and also selectively the first semiconductor thin film 110 on the opening for the base, the contact resistance of the contact portion may be reduced, while being homogenized.

Subsequently, a fourth preferred embodiment of the method of the present invention for manufacturing bipolar NPN transistors is described below with reference to FIGS. 14 to 18.

Figure 14:
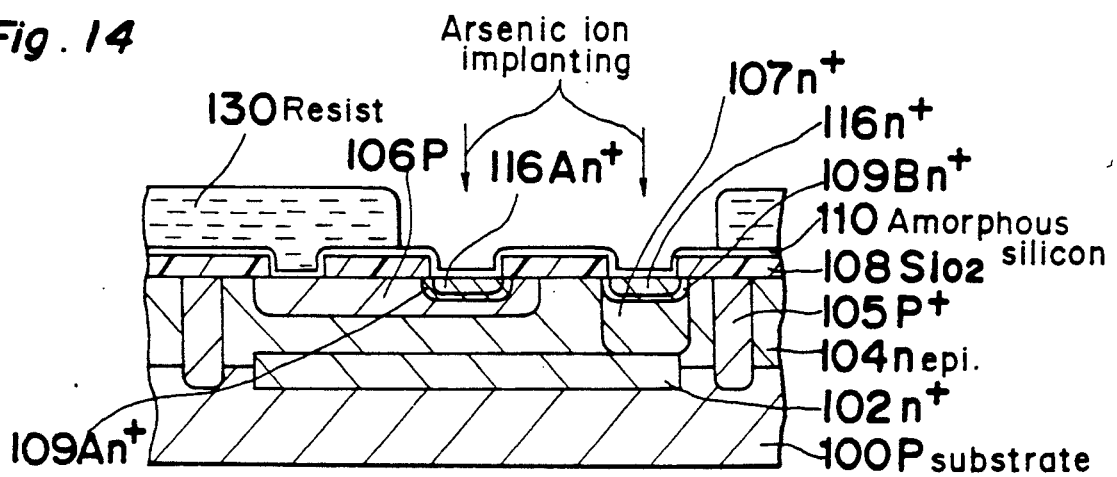
FIG. 14 is a sectional view showing the first process of the manufacturing method for the essential parts of the bipolar NPN transistor in a fourth preferred embodiment of the present invention.

As shown in FIG. 14, after forming an N-type buried layer 102 on a single crystal semiconductor substrate 100, an N-type epitaxial semiconductor layer 104 was formed. After forming a P-type element isolation region 105 and a silicon oxide film 108 of about 120 nanometer, by selectively implanting boron of 1 to $3 \times 10^{13}$ cm$^{-2}$ dose amount into the semiconductor layer 104, a P-type semiconductor region 106 constituting a base (a first semiconductor region) was formed. Similarly, by selectively implanting phosphorus of $5 \times 10^{15}$ cm$^{-2}$ dose amount into the semiconductor layer 104, an N-type semiconductor region 107 constituting the collector lead-out region was formed. The semiconductor regions 106 and 107 were diffused through a heat treatment of about 900° C. Then, after forming a base opening and an emitter opening on the P-type semiconductor region 106 and a collector opening on the N-type semiconductor region 107 constituting the collector lead-out region, by implanting arsenic of $1 \times 10^{15}$ to $1 \times 10^{16}$ cm$^{-2}$ dose amount through these openings, an N-type semiconductor region 109A (a second semiconductor region), constituting part of an emitter, and an N-type semiconductor region 109B, constituting a collector lead-out portion, were formed. And by depositing an amorphous silicon thin film of about 35 nanometer all over the surface and employing a photoresist as a mask, arsenic of $1 \times 10^{15}$ to $1 \times 10^{16}$ cm$^{-2}$ concentration was implanted through the amorphous first silicon thin film 110 with an acceleration energy of 60 to 80 KeV so as to form an N-type semiconductor region 116A (a second semiconductor region), constituting part of an emitter and an N-type semiconductor region, 116b constituting a collector lead-out region. At this time, the natural oxidized film (a first residual insulation film; not shown) of 1.5 to 2 nanometer formed between the P-type semiconductor region 106 and the amorphous silicon thin film 110 constituting the first semiconductor thin film was destroyed by the ion implanting and at the same time, most of the surface side portions of the N-type semiconductor regions 116A and 116B were changed into an amorphous state.

Figure 15:
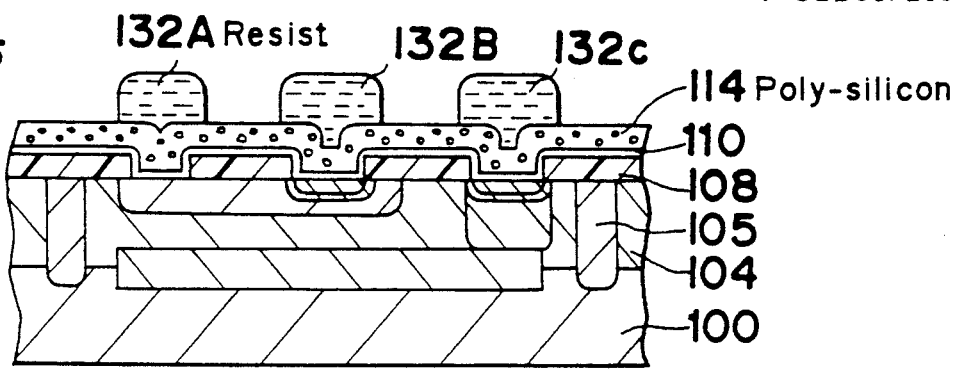
FIG. 15 is a sectional view showing the second process of the manufacturing method for the essential parts of the bipolar NPN transistor in the fourth preferred embodiment of the present invention.

As shown in FIG. 15, after depositing a polysilicon thin film 114 of about 250 nanometer on the polysilicon film 110, resist patterns 132A, 132B, and 132C were respectively formed on the polysilicon thin film 114 (a second semiconductor thin film) formed on the base opening, emitter opening and collector opening. At this time, a natural oxide film of about 1 nanometer (a second residual film; not shown) was formed between the amorphous silicon thin film 110 and the polysilicon thin film 114

Figure 16:
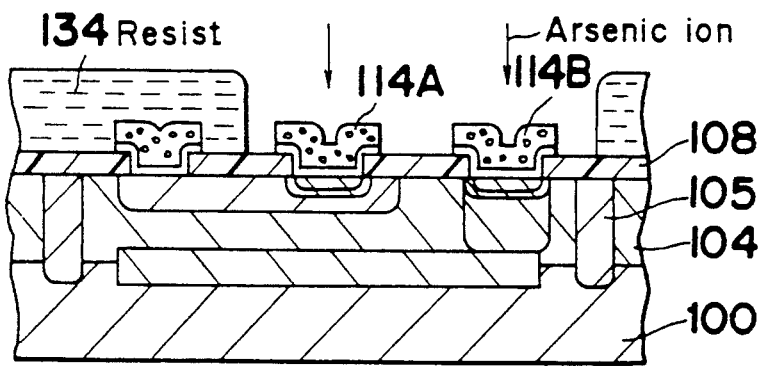
FIG. 16 is a sectional view showing the third process of the manufacturing method for the essential parts of the bipolar NPN transistor in the fourth preferred embodiment of the present invention.

As shown in FIG. 16, after patterning the polysilicon thin film 114 and so on with resist patterns 132A, 132B and 132C (not shown) as masks and, after removing these resist patterns 132A, 132B and 132c, a resist pattern 134 was formed by the photomask process. Using this resist pattern 134 as a mask, arsenic of $8 \times 10^{15}$ cm$^{-2}$ concentration was implanted into polysilicon thin films 114A and 114B with an acceleration energy of 50 KeV.

Figure 17:
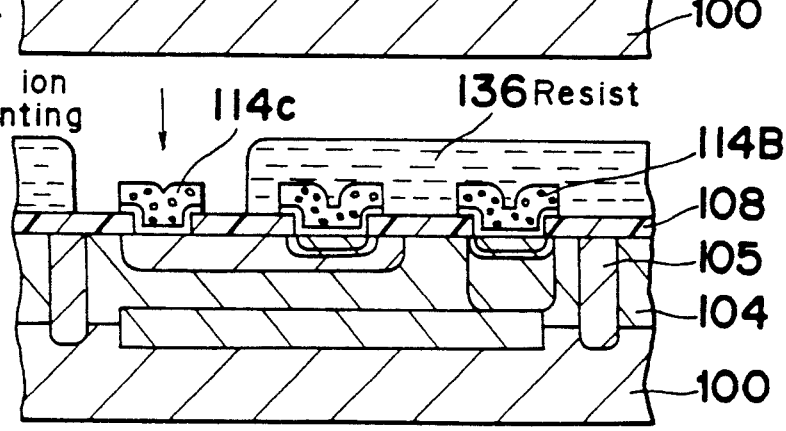
FIG. 17 is a sectional view showing the fourth process of the manufacturing method for the essential parts of the bipolar NPN transistor in the fourth preferred embodiment of the present invention.

As shown in FIG. 17, a resist pattern 136 was formed by the photomask process, and with this as a mask, boron of $8 \times 10^{15}$ cm$^{-2}$ concentration was implanted through the polysilicon thin film 114C with an acceleration energy of more than 100 KeV.

Figure 18:
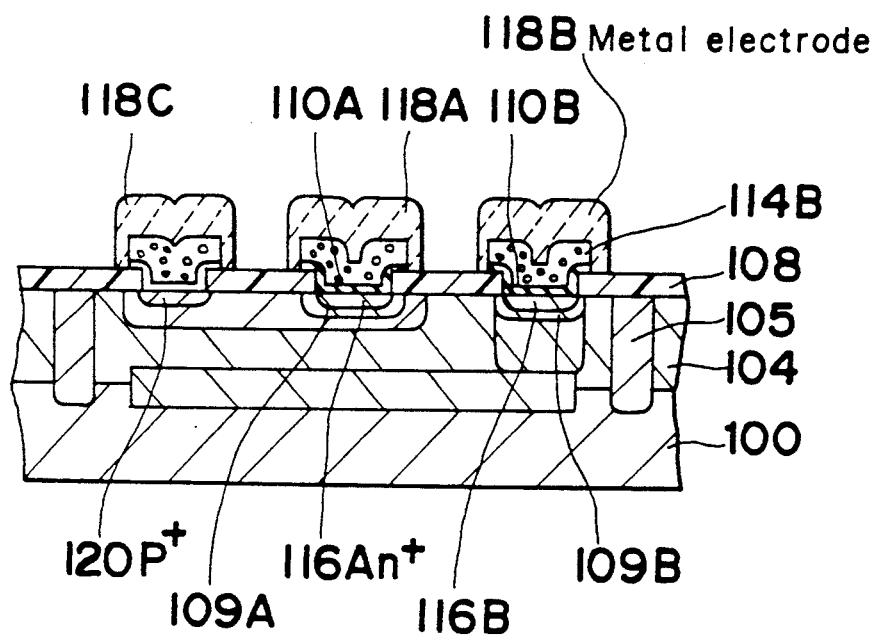
FIG. 18 is a sectional view showing the fifth process of the manufacturing method for the essential parts of the bipolar NPN transistor in the fourth preferred embodiment of the present invention.
Figure 19:
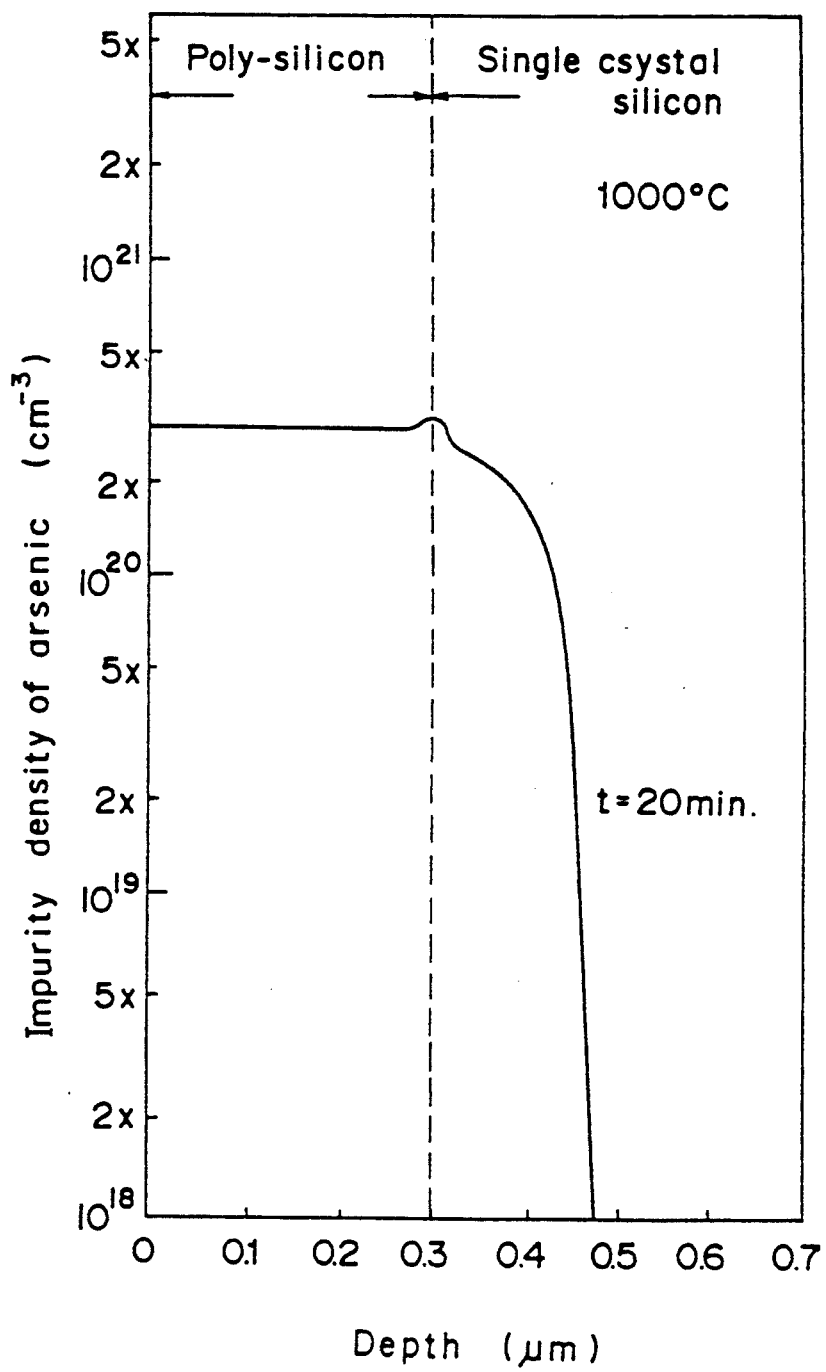
FIG. 19 is a diagram showing the impurity profile of arsenic diffused from polysilicon into the silicon substrate in the prior art.
Figure 20:
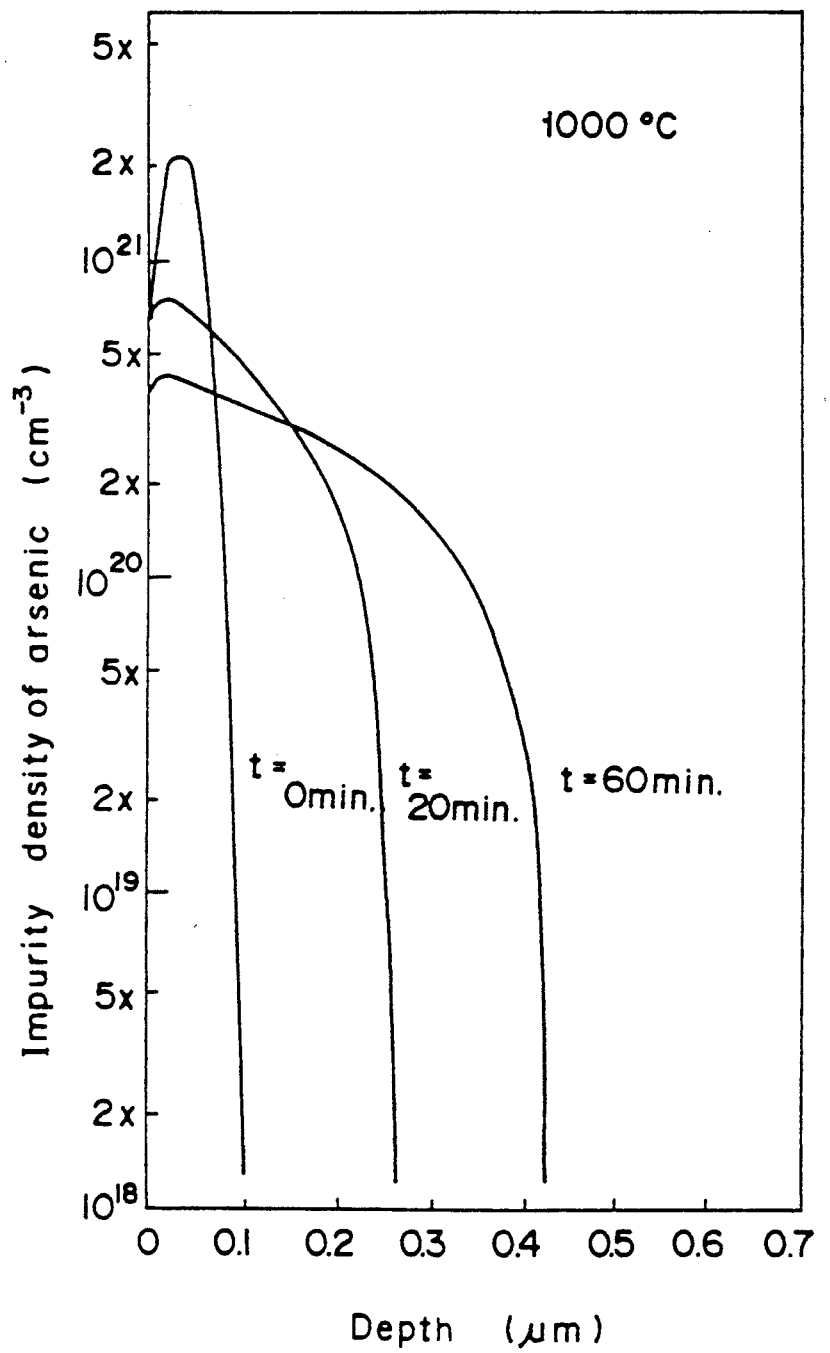
FIG. 20 is a diagram showing the impurity profile of arsenic formed in the silicon substrate by the ion implantation of the prior art.

As shown in FIG. 18, a P-type semiconductor region 120 of about 200 nanometer was formed by a heat treatment of about 900° C. and 30 min., and at the same time, an N-type semiconductor region 109A constituting an emitter of about 200 nanometer depth, and an n-type semiconductor region 109B constituting a collector lead-out region were diffused. At this time, the amorphous portions of N-type semiconductor regions 116A and 116B and the amorphous silicon thin film 110A in contact therewith were transformed by the solid phase epitaxial growth into a single crystal semiconductor region 116A, and the single crystal thin films 110A and 110B. Finally, according to the usual manufacturing method, aluminum electrodes 118A, 118B, and 118C, etc. were formed.

As described hereinabove, according to the method of the present invention, the same effect as in the third preferred embodiment was obtained. By implanting arsenic, etc. through the first semiconductor thin film of polysilicon for the emitter lead-out electrode and so on, an emitter could be formed at a low series resistance, while eliminating the influence of the natural oxide film. Furthermore, the polysilicon electrode for collector lead-out could also be formed at the same time at a low series resistance. On the other hand, by implanting impurities of the first conductive type through the opening on the first insulation film, a homogeneous emitter of a desired depth could be formed with good reproducibility through a heat treatment of a comparatively low diffusion temperature a short time.

The preferred embodiments of the method of the present invention for manufacturing bipolar NPN transistors was described herein. The method of the present invention is also applicable to the case where a semiconductor thin film of such as polysilicon is used for the lead-out electrode of the source or drain of such as MOS transistors. Namely, after forming a well region constituting a first semiconductor region, and a source or a drain constituting a second semiconductor region, by ion implanting impurities constituting part of the source, etc., the residual insulation film (natural oxide film) is destroyed, and further by a heat treatment such as RTA, the first and second residual insulation films were destroyed, and a miniaturized region for source or the like can be formed homogeneously and at a low resistance.

Furthermore, in the general manufacturing method for the bipolar transistor, there is a method which is arranged unlike the herein described method of depositing the polysilicon semiconductor thin film for the emitter after forming an emitter opening on the insulation film formed on the base, and then depositing the polysilicon semiconductor thin film that forms the emitter thereon. This alternative method involves depositing the polysilicon semiconductor thin film directly on the base surface without forming an insulation film on the base, and then selectively patterning the polysilicon semiconductor film into the wiring shape so as to form an emitter electrode. The method of the present invention can be applicable to this method in which the polysilicon semiconductor film consists of a first semiconductor film and a second poly-crystallized semiconductor film. Furthermore, the method of the present invention may be also applicable to various semiconductor devices such as hetero-bipolar, or junction type field effect devices employing Si-Ge and the like.

According to the method of the present invention, the electrical characteristic in the connection between the non-single-crystal semiconductor film used in the transistor or the like in the bipolar type or field effect type circuit, and the semiconductor region containing a high density of impurities is improved. As a result, a manufacturing method for semiconductor devices having a structure excellent for high speed performance and high integration may be provided.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included herein.

What is claimed is:

1. A manufacturing method for semi-conductor devices comprising steps of;

forming a first semiconductor region of a second conductive type on a single crystal semiconductor layer of a first conductive type;

forming a first non-single crystalline semiconductor thin film on the surface of said semiconductor layer, with a first residual insulation film placed therebetween;

implanting ions of an impurity of the first conductive type, through said first semiconductor thin film, into said first semiconductor region to form a second semiconductor region of the first conductive type and, by this ion implanting, destroying said first residual insulation film and, at the same time, forming amorphous regions in said second semiconductor region and said first semiconductor thin film;

forming a second non-single crystalline semiconductor thin film containing an impurity of the first conductive type on said first semiconductor thin film, with a second residual insulation film placed therebetween;

causing a solid phase epitaxial growth in said second semiconductor region and said first semiconductor thin film by a first heat treatment, while aligning to said single crystal semiconductor layer to transform said amorphous regions into single-crystallized first semiconductor thin film and single-crystallized second semiconductor region;

increasing the activation rate of the impurity in said first semiconductor thin film and said second non-single crystalline semiconductor thin film and said second semiconductor regions, through a second heat treatment of a higher temperature and a shorter time than in the first heat treatment; and forming a metallic electrode on said second semiconductor thin film subjected to said second heat treatment.

2. A manufacturing method for semiconductor devices comprising steps of:

forming a first semiconductor region of a second conductive type on a single crystal semiconductor layer of a first conductive type;

forming a non-single-crystalline first semiconductor thin film on said semiconductor layer, with a first residual insulation film placed therebetween;

implanting ions of an impurity of the first conductive type, through said first semiconductor thin film, into said first semiconductor region to form a second semiconductor region of the first conductive type and, by this ion implanting, destroying said first residual insulation film and, at the same time, forming amorphous regions in said second semiconductor region and said first semiconductor thin film;

forming a second non-single crystalline semiconductor thin film containing an impurity of the first conductive type on said first semiconductor thin film, with a second residual insulation film placed therebetween;

causing a solid phase epitaxial growth at said amorphous regions in said second semiconductor region and said first semiconductor thin film by a first heat treatment, while aligning to said single crystal semiconductor layer to transform said amorphous regions into single-crystallized first semiconductor thin film and single-crystallized second semiconductor region;

increasing the activation rate of the impurity in said single-crystallized first semiconductor thin film, and said semiconductor regions said second non-single crystalline semiconductor thin film through a second heat treatment of a higher temperature than in the first heat treatment and a shorter time and, at the same time, forming a non-single-crystalline semiconductor region in succession with said second non-single-crystalline semiconductor thin film in said single-crystallized first semiconductor thin film by destroying said second residual insulation film; and forming a metallic electrode on said second semiconductor thin film subjected to said second heat treatment of a shorter time.

3. The manufacturing method for semiconductor devices in accordance with claim 2, wherein the first heat treatment is effected at less than 900° C., while the second heat treatment is effected at a temperature between 900° C. and 1100° C.

4. The fabrication method for semiconductor devices in accordance with claim 1, where, in order to form amorphous regions without creating semiconductivity therein, additional atomic ions of a neutral conductive type are implanted into a desired region of said semiconductor layer.

5. A fabrication method for semiconductor devices comprising steps of:
forming a first semiconductor region of a second conductive type on a single crystal semiconductor layer of a first conductive type;
forming a second semiconductor region of the first conductive type in said first semiconductor region from the surface of said semiconductor layer;
forming a first non-single crystalline semiconductor thin film on the semiconductor layer whereon said second semiconductor region is formed, with a first residual insulation film placed therebetween;
implanting ions of an impurity of the first conductive type, through said first semiconductor thin film, into said second semiconductor region to form a third semiconductor region of the first conductive type, and, by this ion implanting, destroying said first residual insulation film and, at the same time, forming amorphous regions in said third semiconductor region and said first semiconductor thin film;
forming a second non-single crystalline semiconductor thin film on said first semiconductor thin film, with a second residual insulation film placed therebetween;
causing a solid phase epitaxial growth in said third semiconductor region and said first semiconductor thin film by a first heat treatment, while aligning to said single crystal semiconductor layer to transform said amorphous regions into single-crystallized first semiconductor thin film and single-crystallized third semiconductor region;
increasing the activation rate of the impurity in said single-crystallized first semiconductor thin film, said second non-single crystalline semiconductor thin film through a second heat treatment of a higher temperature and a shorter time than in said first heat treatment; and
forming a metallic electrode on the second semiconductor thin film subjected to said second heat treatment of a shorter time.

6. The manufacturing method for semiconductor devices in accordance with claim 5, wherein the first heat treatment is effected at less than 900° C., while the second heat treatment is effected at a temperature between 900° C. and 1100° C.

7. A fabrication method for semiconductor devices comprising steps of:
forming a first semiconductor region of a second conductive type on a single crystal semiconductor layer of a first conductive type;
forming a second semiconductor region of the first conductive type on said first semiconductor region from the surface of said semiconductor layer;
forming a first non-single crystalline semiconductor thin film on the surface of the semiconductor layer whereon said second semiconductor region is formed, with a first residual insulation film placed therebetween;
implanting ions of an impurity of the first conductive type, through said first semiconductor thin film, into said second semiconductor region to form a third semiconductor region of the first conductive type and, by this ion implanting, destroying said first residual insulation film and, at the same time, forming amorphous regions in said third semiconductor region and said first semiconductor thin film;
forming a second non-single crystalline semiconductor thin film containing an impurity of the first conductive type on said first semiconductor thin film, with a second residual insulation film placed therebetween;
causing a solid phase epitaxial growth at said amorphous regions in said third semiconductor region and said first semiconductor thin film by a first heat treatment, while aligning to said single crystal semiconductor layer to transform said amorphous regions into single-crystallized first semiconductor thin film and single-crystallized third semiconductor region;

increasing the activation rate of impurities of the second conductive type in said single-crystallized first semiconductor thin film, said second semiconductor thin film of non-single-crystal type and said semiconductor regions, through a second heat treatment of a higher temperature than in said first heat treatment and a shorter time, and, at the same time, destroying said second residual insulation film so as to form a non-single-crystalline semiconductor region in succession with said second polycrystalline semiconductor thin film into said single-crystallized first semiconductor thin film; and forming a metallic electrode on said second semiconductor thin film subjected to said second heat treatment.

8. The fabrication method for semiconductor devices in accordance with claim 7, wherein the first heat treatment is effected at less than 900° C., while the second heat treatment is effected at a temperature between 900° C. and 1100° C.

9. A fabrication method for semiconductor devices comprising steps of:

forming a first semiconductor region of a second conductive type in a single crystalline semiconductor layer;

forming a second semiconductor region of a first conductive type in said first semiconductor region from the surface of said semiconductor layer;

forming a non-single crystalline semiconductor thin film on the surface of said semiconductor layer where said second semiconductor region has been formed, with a first residual insulation film put therebetween;

implanting ions of an impurity of the first conductive type, through said first semiconductor thin film, into said second semiconductor region to form a third semiconductor region of the first conductive type and, by this ion implanting, destroying said first residual insulation film and, at the same time, forming amorphous regions in said third semiconductor region and said first semiconductor thin film;

forming a second non-single crystalline semiconductor thin film containing an impurity of the first conductive type on said first semiconductor thin film with a second residual insulation film put therebetween;

causing a solid phase epitaxial growth at said amorphous regions in said third semiconductor region and said first semiconductor thin film by a first heat treatment, while aligning to said single crystal semiconductor layer to transform said amorphous regions into single-crystallized first semiconductor thin film and single-crystallized third semiconductor region;

increasing the activation rate of the impurity in said single-crystallized first semiconductor through a second heat treatment of a higher temperature and a shorter time than in the first heat treatment and, at the same time, forming a non-single-crystalline semiconductor region in said single-crystallized first semiconductor thin film in succession with said second non-single crystalline semiconductor thin film by destroying said second residual insulation film; and forming a metallic electrode on said second semiconductor thin film subjected to said second heat treatment of a shorter time.

10. The fabrication method for semiconductor devices in accordance with claim 9 wherein the first heat treatment is at less than 900° C., while the second heat treatment is effected at a temperature between 900° C. and 1100° C.

11. The fabrication method for semiconductor devices in accordance with claim 1, wherein said non-single-crystalline second thin film has a double layered structure of non-single-crystalline semiconductor thin film and a conductive thin film having a high melting point.

* * * * *